United States Patent
Reed et al.

(10) Patent No.: US 10,804,871 B1
(45) Date of Patent: Oct. 13, 2020

(54) CRYOGENIC RADIO-FREQUENCY RESONATOR FOR SURFACE ION TRAPS

(71) Applicant: Honeywell International Inc., Morris Plains, NJ (US)

(72) Inventors: Adam Reed, Longmont, CO (US); Benjamin Spaun, Westminster, CO (US); Zachary Price, Broomfield, CO (US)

(73) Assignee: Honeywell International Inc., Morris Plains, NJ (US)

(*) Notice: Subject to any disclaimer, the term of this patent is extended or adjusted under 35 U.S.C. 154(b) by 0 days.

(21) Appl. No.: 16/412,278

(22) Filed: May 14, 2019

(51) Int. Cl.
| | | |
|---|---|---|
| *H03H 7/01* | (2006.01) | |
| *H03H 5/10* | (2006.01) | |
| *H03H 7/38* | (2006.01) | |
| *H01J 49/02* | (2006.01) | |
| *G06N 10/00* | (2019.01) | |

(52) U.S. Cl.
CPC ............ *H03H 7/17* (2013.01); *H03H 5/10* (2013.01); *H03H 7/38* (2013.01); *G06N 10/00* (2019.01); *H01J 49/022* (2013.01); *H03H 2210/025* (2013.01)

(58) Field of Classification Search
CPC .. H03H 7/17; H03H 7/38; G06N 10/00; H01J 49/4225
See application file for complete search history.

(56) References Cited

U.S. PATENT DOCUMENTS 9,826,622 B2* 11/2017 Kuemmeth .......... H05K 1/0204
10,496,932 B2* 12/2019 Kim .................... H03H 7/38

FOREIGN PATENT DOCUMENTS

WO WO-2015128438 A1 * 9/2015 ............. G06N 10/00

OTHER PUBLICATIONS

Gandolfi, "Compact RF Amplifier for Scalable Ion-Traps", 2011, retrieved from https://quantumoptics.at/en/publications/master-diploma-theses.html (Year: 2011).*

(Continued)

*Primary Examiner* — Ryan Johnson
(74) *Attorney, Agent, or Firm* — Schwegman Lundberg & Woessner, P.A.

(57) ABSTRACT

The present subject matter provides technical solutions for the technical problems facing cryogenic ion traps by providing a cryogenic radio-frequency (RF) resonator that is compact, monolithic, modular, and impedance-matched to a cryogenic ion trap. The cryogenic RF resonator described herein is power-efficient, properly impedance-matched to the RF source, has a stable gain profile, and is compatible with a low temperature and ultra-high vacuum environment. In some examples, the gain profile is selected so that the cryogenic RF resonator acts as a cryogenic RF amplifier. This cryogenic RF resonator improves the performance of ion traps by reducing or minimizing the heat load and reducing or minimizing the unwanted noise that may erroneously drive trapped ions. These features of the present subject matter improve the performance of atomic clocks and mass spectrometers, and especially improve the performance of trapped ion quantum computers.

20 Claims, 4 Drawing Sheets

(56) References Cited

OTHER PUBLICATIONS

Brandl, M. F., et al., "Cryogenic resonator design for trapped ion experiments in Paul traps", *Appl. Phys. B*, 122:157, (2016), 9 pgs.
Gandolfi, D., et al., "Compact radio-frequency resonator for cryogenic ion traps", *Review of Scientific Instruments*, 83, 084705, (2012), 6 pgs.
Poitzsch, M. E., et al., "Cryogenic linear ion trap for accurate spectroscopy", *Review of Scientific Instruments*, 67(1), (Jan. 1996), 129-134.

* cited by examiner

CRYOGENIC RADIO-FREQUENCY RESONATOR FOR SURFACE ION TRAPS

TECHNICAL FIELD

Embodiments described herein generally relate to quantum computing applications.

BACKGROUND

Cryogenic ion traps (e.g., surface ion traps) are an emerging technology that enable the confinement of ions for applications in quantum computing, quantum sensing, quantum timing, and other applications in quantum technology. During operation, these ion traps use input radio-frequency drive signals at relatively high voltages. However, operating such ion traps at cryogenic temperatures may result in unwanted power dissipation. What is needed is an improved solution to increase the efficiency of a cryogenic ion trap system.

DESCRIPTION OF EMBODIMENTS

Figure 1:
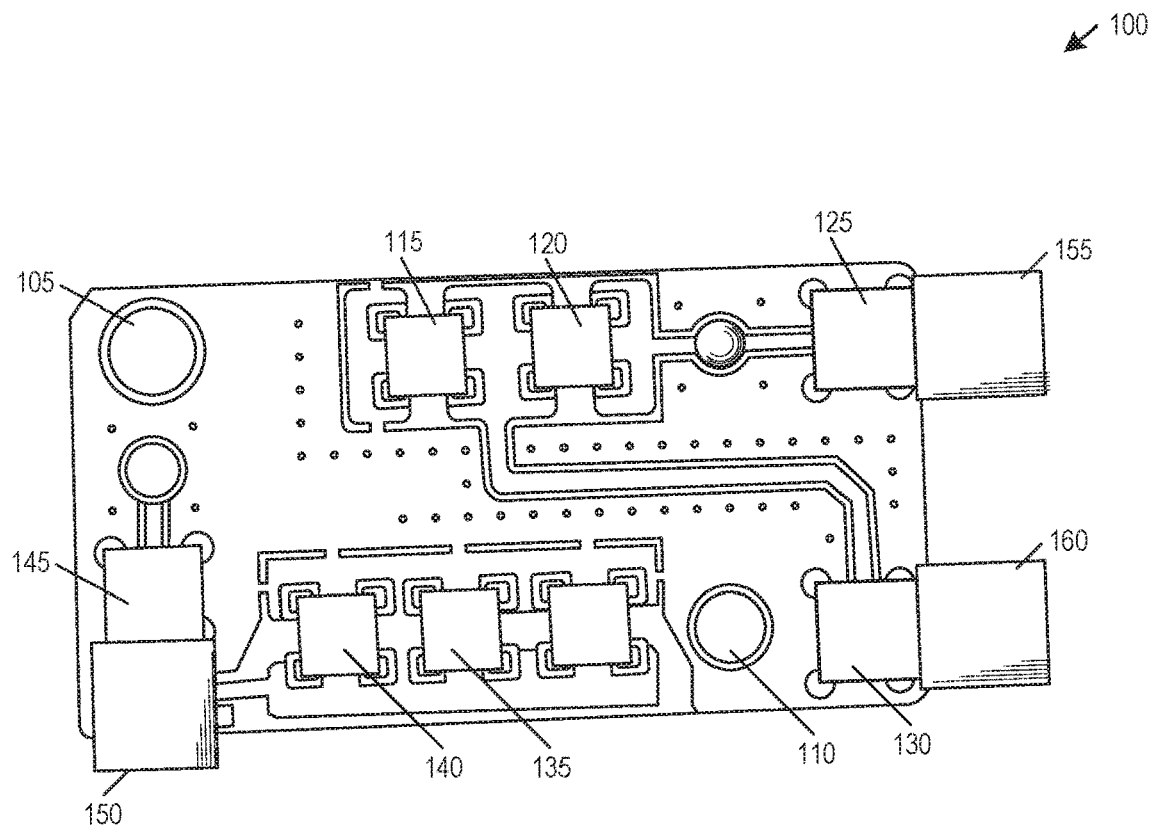
FIG. 1 is an overhead view of a cryogenic RF resonator circuit board, according to an embodiment.

The present subject matter provides technical solutions for the technical problems facing cryogenic ion traps by providing a cryogenic radio-frequency (RF) resonator that is compact, monolithic, modular, and impedance-matched to a cryogenic ion trap. The cryogenic RF resonator described herein is power-efficient, properly impedance-matched to the RF source, has a stable gain profile, and is compatible with a low temperature and ultra-high vacuum environment. In some examples, the gain profile is selected so that the cryogenic RF resonator acts as a cryogenic RF amplifier. This cryogenic RF resonator improves the performance of ion traps by reducing or minimizing the heat load and reducing or minimizing the unwanted noise that may erroneously drive trapped ions. These features of the present subject matter improve the performance of atomic clocks and mass spectrometers, and especially improve the performance of quantum computing. In an example, a cryogenic RF resonator and ion trap package may be used to store quantum information using qubits (e.g., stable electronic states of ions), and quantum information can be processed and transferred through the collective quantized motion of the ions. One or more ion-specific lasers may be applied to the ions to induce coupling of the ions between qubit states or to induce coupling between internal qubit states and external motional states.

The cryogenic RF resonator described herein provides various advantages. The cryogenic RF resonator may dissipate reduced power inside a cryostat (e.g., cryogenic chamber), such as power levels of approximately 100 mW or lower. This reduces the power required to operate the cryostat, especially for cryostats operated from approximately 4 Kelvin to approximately 77 Kelvin. The cryogenic RF resonator may provide a gain profile that provides state-of-the-art stability without the use of active feedback in a circuit. As described below, selection of capacitance and inductance values may provide a desired gain profile without the need for active feedback within the circuit. The cryogenic RF resonator may provide a compact and modular form factor. This enables the use of this cryogenic RF resonator with various ion traps. The cryogenic RF resonator may provide an integrated voltage pick-off circuit. If the cryogenic RF resonator is used as an amplifier, this voltage pick-off circuit may be used to monitor a voltage gain of the amplifier.

The cryogenic RF resonator described herein provides various advantages over other RF resonators. In an example, the cryogenic RF resonator provides an RF output that is impedance-matched to an RF source. In an example, this cryogenic RF resonator provides an improved design, including a form factor that is compact, modular, and monolithic (e.g., substantially solid and uniform). Some RF resonators may be implemented using bulky helical resonators or using discrete components mounted directly to ion trap circuit boards. However, because those RF resonators are not monolithic, they are sensitive to mechanical vibrations that degrade the stability of the circuit gain profile. In contrast, this cryogenic RF resonator includes a formed substrate (e.g., epoxy) to provide a monolithic circuit that reduces or eliminates susceptibility to mechanical vibrations. This cryogenic RF resonator is also compact and modular, which provides the ability to use this cryogenic RF resonator for providing impedance-matched RF signals to various ion trap devices.

The following description and the drawings sufficiently illustrate specific embodiments to enable those skilled in the art to understand the specific embodiment. Other embodiments may incorporate structural, logical, electrical, process, and other changes. Portions and features of various embodiments may be included in, or substituted for, those of other embodiments. Embodiments set forth in the claims encompass all available equivalents of those claims.

FIG. 1 is an overhead view of a cryogenic RF resonator circuit board 100, according to an embodiment. Circuit board 100 may include mounting holes 105 and 110 for fixing the circuit board 100 to an enclosure. Circuit board 100 may include various RF input and output ports, such as RF input port 150, RF input mount 145, output port 155, and RF output mount 125. Circuit board 100 may include an integrated voltage pick-off circuit, which may be used to monitor a voltage gain. In an example, the voltage pick-off circuit includes surface mount components 115 and 120, along with voltage pick-off port 160 and voltage pick-off mount 130. Circuit board 100 may include various circuit components to modify an input RF signal received at the RF input port 155, such as capacitors 135 and 140. These capacitors may be coupled with one or more inductors, such as shown in FIG. 2.

Figure 2:
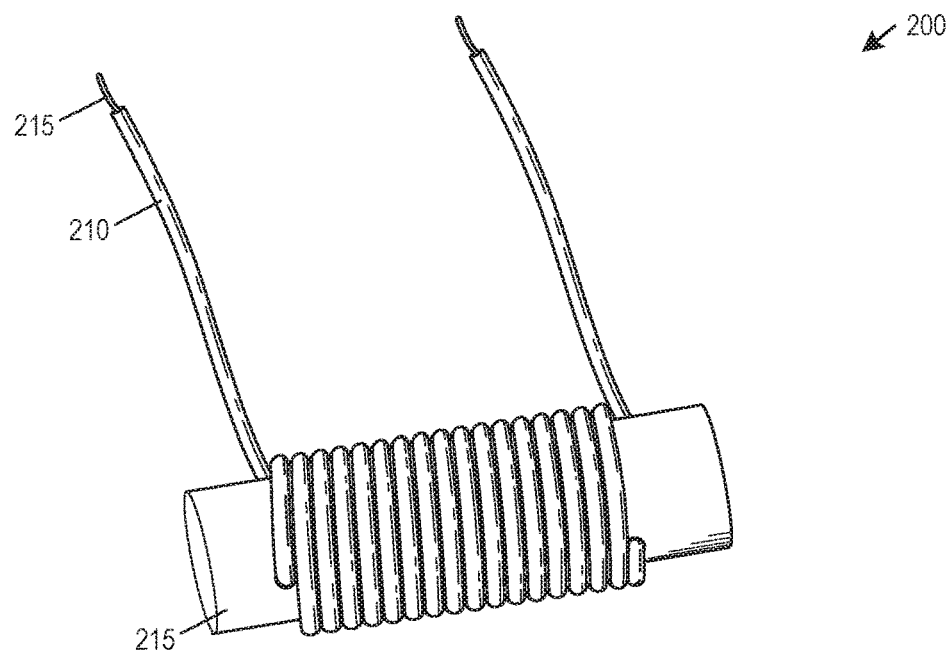
FIG. 2 is an overhead view of a cryogenic RF resonator inductor, according to an embodiment.

FIG. 2 is an overhead view of a cryogenic RF resonator inductor 200, according to an embodiment. Inductor 200 may include a conductive wire 205 within an insulating sheath 210. The wire 205 and sheath 210 may be wound around a dielectric core 215. The dielectric used in the dielectric core 215 may be selected to provide mechanical stability for the inductor coil and a desired dielectric constant. For example, the dielectric core 215 and capacitors 135 and 140 may include materials to provide consistent dielectric properties (e.g., a narrow range of dielectric constant values) within cryogenic operating conditions, such as between approximately 4 Kelvin and approximately 77 Kelvin. The dielectric materials and other materials used for components of the inductor 200 and the circuit board 100 may be selected to provide stable characteristics over temperature, voltage, and RF frequency ranges used in operation of cryogenic ion traps.

The impedance of inductor 200 and capacitance of capacitors 135 and 140 may be selected to form an impedance-matching circuit, such as in an L-network formation. In an example, a network analyzer may be used to determine the real and imaginary parts of impedance of an ion trap, and the impedance of inductor 200 and capacitance of capacitors 135 and 140 may be selected to match the ion trap impedance. For cryogenic applications, the real part of the ion trap impedance and the real part of the cryogenic resonator impedance is expected to change as the operating temperature is decreased. To address this temperature dependence of the real part of the impedance, multiple impedance measurements may be taken as the device is cooled, and the multiple impedance measurements may be used to extrapolate impedance values for the ion trap at various operating temperatures. Based on the measured and extrapolated impedance values for the ion trap at various operating temperatures, the impedance of inductor 200 and capacitance of capacitors 135 and 140 may be selected to match the ion trap impedance.

Figure 3:
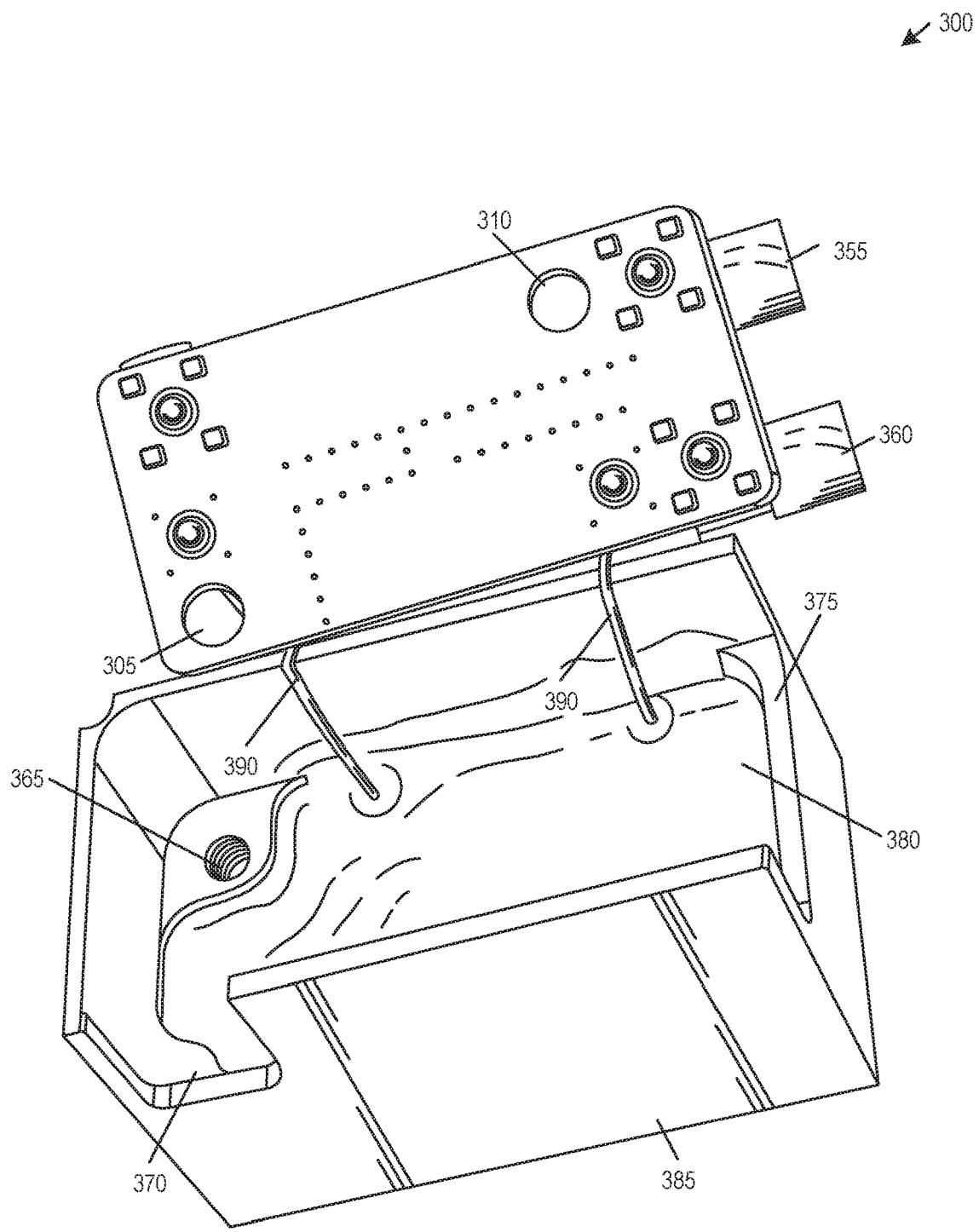
FIG. 3 is a perspective view of a cryogenic RF resonator open enclosure, according to an embodiment.

FIG. 3 is a perspective view of a cryogenic RF resonator open enclosure 300, according to an embodiment. The open enclosure may include a cavity into which the inductor is placed with inductor contacts 390 exposed. The cavity may be filled with a thermally conductive substrate 380 such as epoxy. The substrate 380 may ensure the inductor is stabilized relative to the enclosure 300, and the thermal conductivity of the substrate 380 may be selected to conduct heat away from the inductor to the enclosure 300, which in turn conducts heat away to the cryogenic cooling system.

Enclosure 300 may be formed from materials that are thermally conductive and operate at cryogenic application temperatures. Enclosure 300 may include a high-purity copper, such as oxygen-free high thermal conductivity (OFHC) copper. Enclosure 300 may include a thermally conductive external gold plating, such as on outer surface 385. Enclosure 300 may include mounting surfaces 370 and 375, which may be used to position the circuit board. Enclosure 300 may include threaded mounting aperture, such as threaded aperture 365 that may be used with a bolt or other fastener through circuit board aperture 305.

Figure 4:
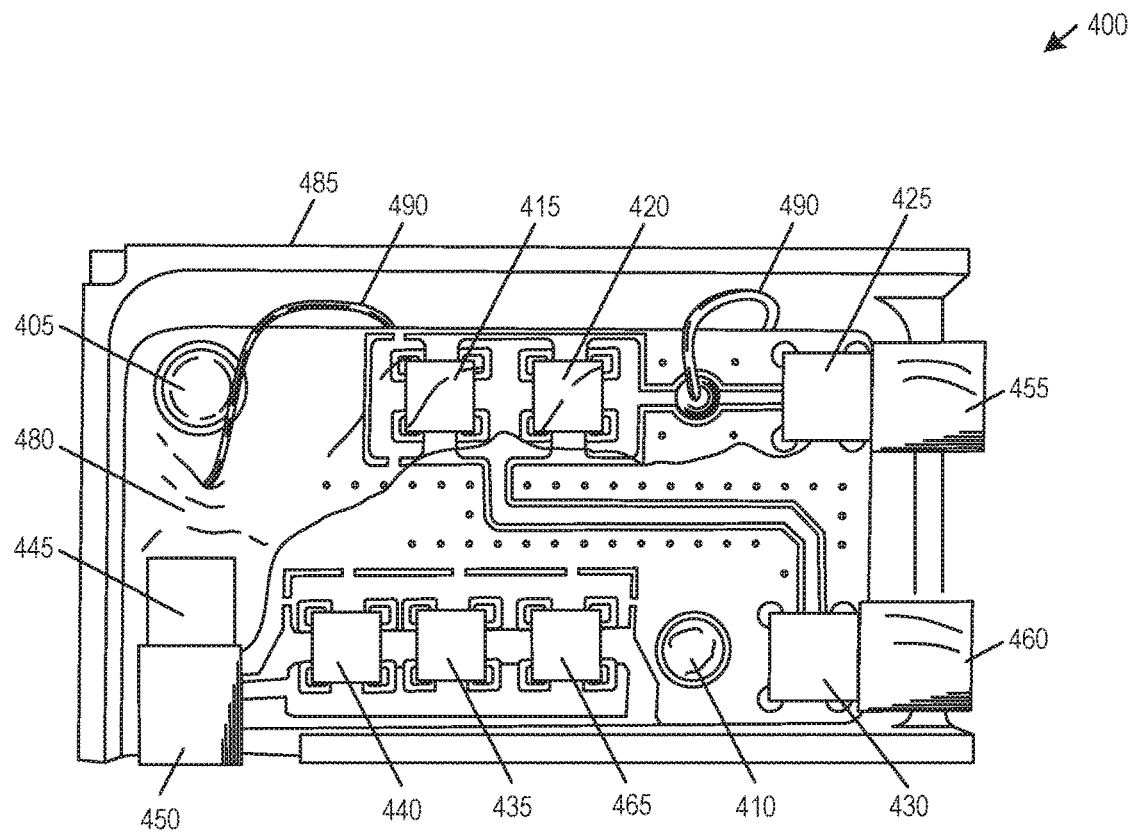
FIG. 4 is a top view of a cryogenic RF resonator open enclosure, according to an embodiment.

FIG. 4 is a top view of a cryogenic RF resonator open enclosure 400, according to an embodiment. Enclosure 400 may include a cryogenic RF resonator circuit board, which may be fastened to enclosure 400 through board apertures 405 and 410. Inductor leads 490 may be routed from an inductor to corresponding contacts on the circuit board. A thermally conductive substrate 380 may be used to cover inductor leads 490, such as to provide structural stability and thermal conductivity. One or more of the circuit board components 415 and 420 may be covered partially or completely with substrate 380 to further improve structural stability and thermal conductivity. Other circuit board components 435, 440, and 465 may be left uncovered by substrate 380, such as to provide a user-modifiable impedance. For example, components 435, 440, and 465 may include capacitors of common or different capacitance, and one or more of components 435, 440, and 465 may be removed or replaced with a different component. In an example, components 435, 440, and 465 may be replaced by a user-adjustable variable capacitor. This selection or modification of components 435, 440, and 465 may provide a desired capacitance, which may be used to modify the cryogenic RF resonator to provide an impedance that matches an ion trap.

Figure 5:
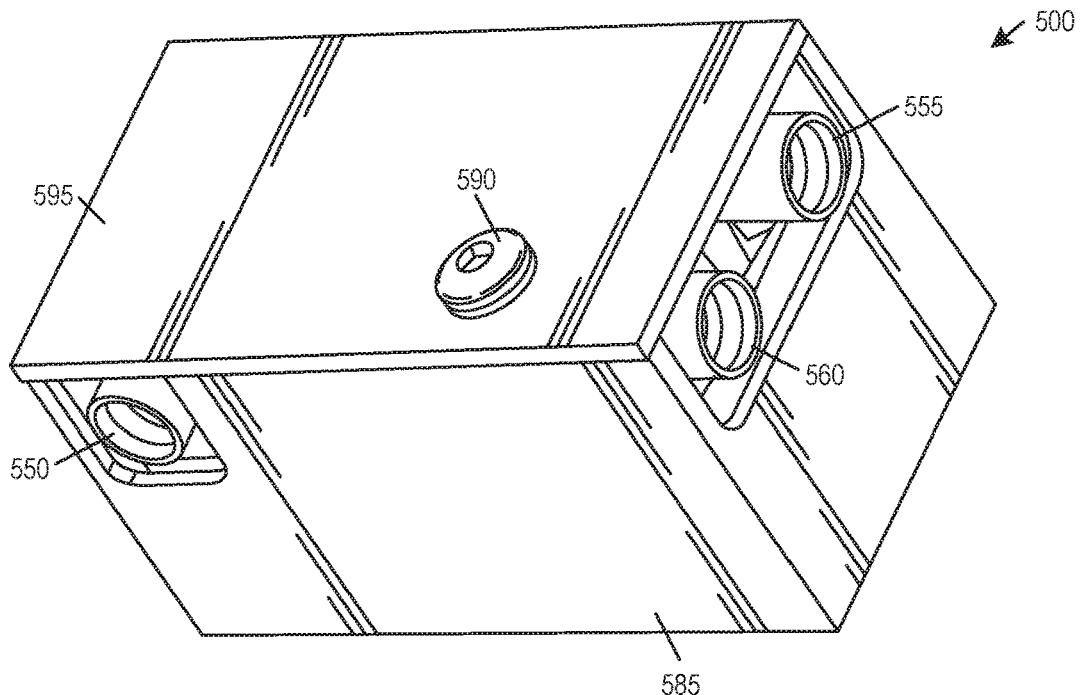
FIG. 5 is a perspective view of a cryogenic RF resonator closed enclosure, according to an embodiment.

FIG. 5 is a perspective view of a cryogenic RF resonator closed enclosure 500, according to an embodiment. Enclosure 500 includes a thermally conductive lower enclosure 585 and a thermally conductive upper surface 595, which may be fastened together using a bolt or other fastener 590. The closed enclosure 500 may include apertures, such as for RF output port 555 connecting the resonator with the ion trap, RF input port 550, or voltage pick-off port 560.

In operation, the cryogenic RF resonator within enclosure 500 may be used to verify the cryogenic RF resonator is impedance-matched to an ion trap. For example, cryogenic RF resonator may be connected to an ion trap, the cryogenic RF resonator and ion trap may be cooled to a low cryogenic temperature (e.g., 4 Kelvin), and a network analyzer may be used to measure power reflected back from the ion trap. This measured power may be used to determine an internal quality factor (e.g., resonator loss measurement), which may be used to verify that the cryogenic RF resonator is properly impedance-matched to ion trap.

Figure 6:
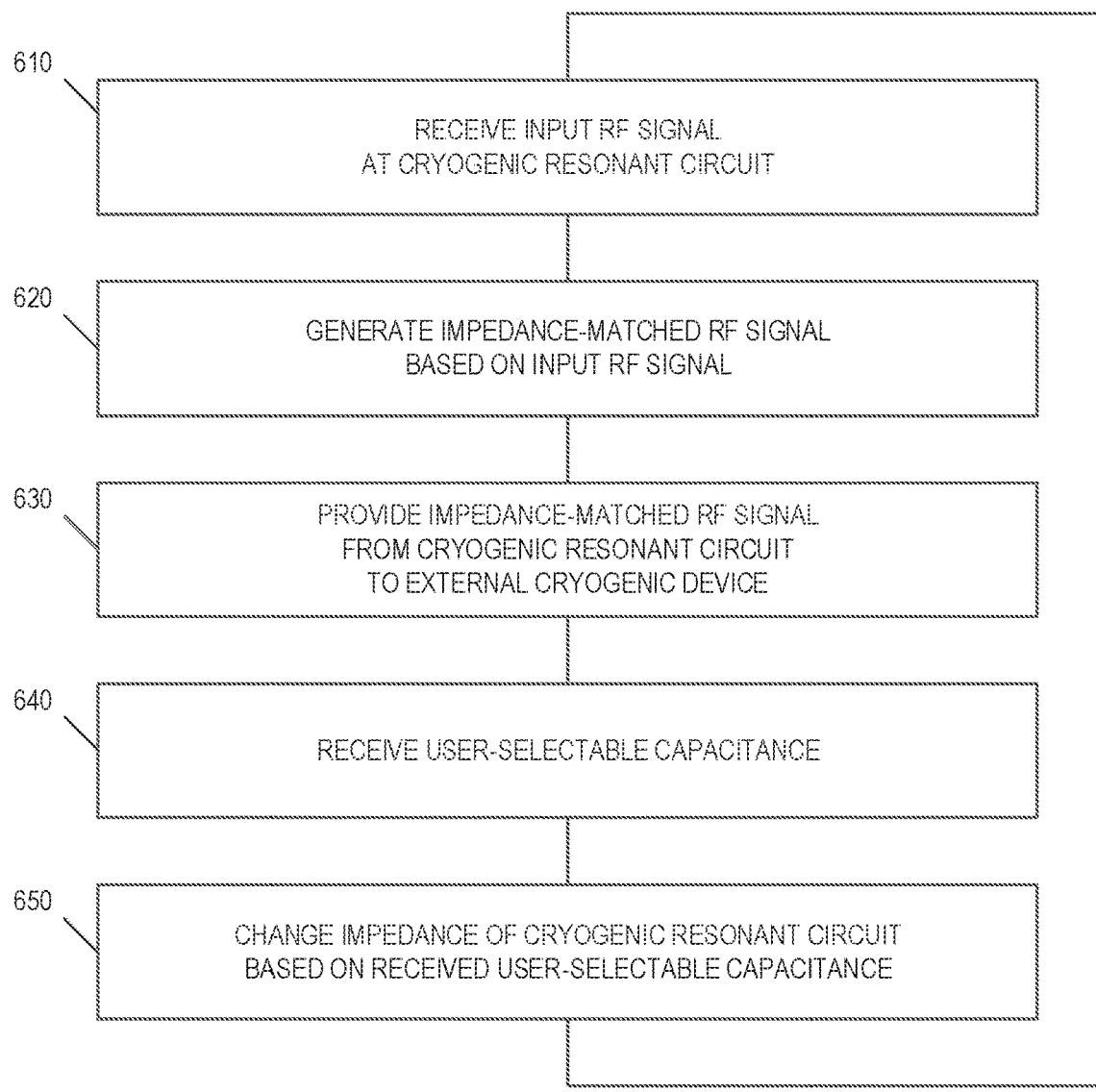
FIG. 6 is a block diagram of a cryogenic RF resonator method, according to an embodiment.

FIG. 6 is a block diagram of a cryogenic RF resonator method 600, according to an embodiment. Method 600 may include receiving 610 an input radio-frequency (RF) signal via an RF input port at a cryogenic resonant circuit. The cryogenic resonant circuit may include an inductive device disposed at least partially within a thermally conductive substrate and a cryogenic capacitive device coupled to the inductor. Method 600 may include generating 620 an impedance-matched RF signal at the cryogenic resonant circuit based on the input RF signal. Method 600 may include providing 630 the impedance-matched RF signal via an RF output port to an external cryogenic device.

In an example, the cryogenic resonant circuit serves as an amplifier circuit. The generation of the impedance-matched RF signal at the cryogenic resonant circuit may include generating an impedance-matched amplified RF signal. The provision of the impedance-matched RF signal may include providing the impedance-matched amplified RF signal to the external cryogenic device.

The cryogenic resonant circuit may be disposed within a thermally conductive enclosure. The thermally conductive enclosure may include a thermally conductive high-purity copper. The thermally conductive enclosure may include a thermally conductive gold plating. The thermally conductive enclosure may include at least one thermally conductive surface configured to mate with a thermally conductive mounting substrate.

The cryogenic capacitive device may be configured to provide an adjustable capacitance, where the capacitance may be adjusted based on the user input or based on other changes. In an example, method 600 may include receiving 640 a user-selectable capacitance input to provide the adjustable capacitance, where the user-selectable capacitance may include a user adjustment to a variable capacitor. In an example, the cryogenic capacitive device may include a plurality of conductors, and each of the plurality of capacitors may be configured to be removable by a user to provide the adjustable capacitance. The capacitance may be adjusted to provide a desired impedance, such as to provide a desired impedance value. In an example, the cryogenic capacitive device may include materials to provide consistent dielectric properties and to provide other stable characteristics over temperature, voltage, and RF frequency ranges used in operation of cryogenic ion traps.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

Example 1 is a cryogenic radio-frequency resonator system comprising: an inductive device disposed at least partially within a thermally conductive substrate; a cryogenic capacitive device coupled to the inductor to form a cryogenic resonant circuit with an associated circuit impedance value; a radio-frequency (RF) input port to route an input RF signal to the cryogenic resonant circuit, the cryogenic resonant circuit generating an impedance-matched RF signal; and an RF output port to provide the impedance-matched RF signal to an external cryogenic device.

In Example 2, the subject matter of Example 1 optionally includes wherein: the cryogenic resonant circuit includes an amplifier circuit; the amplifier circuit generates an impedance-matched amplified RF signal; and the RF output port provides the impedance-matched amplified RF signal to the external cryogenic device.

In Example 3, the subject matter of any one or more of Examples 1-2 optionally include a thermally conductive enclosure.

In Example 4, the subject matter of Example 3 optionally includes wherein the thermally conductive enclosure includes a thermally conductive high-purity copper.

In Example 5, the subject matter of any one or more of Examples 3-4 optionally include wherein the thermally conductive enclosure includes a thermally conductive gold plating.

In Example 6, the subject matter of any one or more of Examples 3-5 optionally include wherein the thermally conductive enclosure includes at least one thermally conductive surface configured to mate with a thermally conductive mounting substrate.

In Example 7, the subject matter of any one or more of Examples 1-6 optionally include wherein the cryogenic capacitive device includes a low-temperature capacitive material.

In Example 8, the subject matter of any one or more of Examples 1-7 optionally include wherein the cryogenic capacitive device is configured to provide an adjustable capacitance, the adjustable capacitance modifying the amplifier impedance.

In Example 9, the subject matter of Example 8 optionally includes wherein the cryogenic capacitive device includes a plurality of conductors, each of the plurality of capacitors configured to be removable to provide the adjustable capacitance.

In Example 10, the subject matter of any one or more of Examples 8-9 optionally include wherein the cryogenic capacitive device includes a user-selectable capacitance to provide the adjustable capacitance.

Example 11 is a cryogenic radio-frequency resonator method comprising: receiving an input radio-frequency (RF) signal via an RF input port at a cryogenic resonant circuit, the cryogenic resonant circuit including an inductive device disposed at least partially within a thermally conductive substrate and a cryogenic capacitive device coupled to the inductor; generating an impedance-matched RF signal at the cryogenic resonant circuit based on the input RF signal; and providing the impedance-matched RF signal via an RF output port to an external cryogenic device.

In Example 12, the subject matter of Example 11 optionally includes wherein: the cryogenic resonant circuit includes an amplifier circuit; the generation of the impedance-matched RF signal at the cryogenic resonant circuit includes generating an impedance-matched amplified RF signal; and the provision of the impedance-matched RF signal includes providing the impedance-matched amplified RF signal to the external cryogenic device.

In Example 13, the subject matter of any one or more of Examples 11-12 optionally include wherein the cryogenic resonant circuit is disposed within a thermally conductive enclosure.

In Example 14, the subject matter of Example 13 optionally includes wherein the thermally conductive enclosure includes a thermally conductive high-purity copper.

In Example 15, the subject matter of any one or more of Examples 13-14 optionally include wherein the thermally conductive enclosure includes a thermally conductive gold plating.

In Example 16, the subject matter of any one or more of Examples 13-15 optionally include wherein the thermally conductive enclosure includes at least one thermally conductive surface configured to mate with a thermally conductive mounting substrate.

In Example 17, the subject matter of any one or more of Examples 11-16 optionally include wherein the cryogenic capacitive device includes a low-temperature capacitive material.

In Example 18, the subject matter of any one or more of Examples 11-17 optionally include wherein the cryogenic capacitive device is configured to provide an adjustable capacitance, the adjustable capacitance modifying the amplifier impedance.

In Example 19, the subject matter of Example 18 optionally includes wherein the cryogenic capacitive device includes a plurality of conductors, each of the plurality of capacitors configured to be removable to provide the adjustable capacitance.

In Example 20, the subject matter of any one or more of Examples 18-19 optionally include receiving a user-selectable capacitance input to provide the adjustable capacitance.

Example 21 is one or more machine-readable medium including instructions, which when executed by a computing system, cause the computing system to perform any of the methods of Examples 11-20.

Example 22 is an apparatus comprising means for performing any of the methods of Examples 11-20.

Example 23 is a machine-readable storage medium comprising a plurality of instructions that, when executed with a processor of a device, cause the device to: receive an input radio-frequency (RF) signal via an RF input port at a cryogenic resonant circuit, the cryogenic resonant circuit including an inductive device disposed at least partially within a thermally conductive substrate and a cryogenic capacitive device coupled to the inductor; generate an impedance-matched RF signal at the cryogenic resonant circuit based on the input RF signal; and provide the impedance-matched RF signal via an RF output port to an external cryogenic device.

In Example 24, the subject matter of Example 23 optionally includes wherein: the cryogenic resonant circuit includes an amplifier circuit; the instructions further causing the device to generate an impedance-matched amplified RF signal; and the instructions further causing the device to provide the impedance-matched amplified RF signal to the external cryogenic device.

In Example 25, the subject matter of any one or more of Examples 23-24 optionally include wherein the cryogenic resonant circuit is disposed within a thermally conductive enclosure.

In Example 26, the subject matter of Example 25 optionally includes wherein the thermally conductive enclosure includes a thermally conductive high-purity copper.

In Example 27, the subject matter of any one or more of Examples 25-26 optionally include wherein the thermally conductive enclosure includes a thermally conductive gold plating.

In Example 28, the subject matter of any one or more of Examples 25-27 optionally include wherein the thermally conductive enclosure includes at least one thermally conductive surface configured to mate with a thermally conductive mounting substrate.

In Example 29, the subject matter of any one or more of Examples 23-28 optionally include wherein the cryogenic capacitive device includes a low-temperature capacitive material.

In Example 30, the subject matter of any one or more of Examples 23-29 optionally include wherein the cryogenic capacitive device is configured to provide an adjustable capacitance, the adjustable capacitance modifying the amplifier impedance.

In Example 31, the subject matter of Example 30 optionally includes wherein the cryogenic capacitive device includes a plurality of conductors, each of the plurality of capacitors configured to be removable to provide the adjustable capacitance.

In Example 32, the subject matter of any one or more of Examples 30-31 optionally include the instructions further causing the device to receive a user-selectable capacitance input to provide the adjustable capacitance.

Example 33 is a cryogenic radio-frequency resonator apparatus comprising: means for receiving an input radio-frequency (RF) signal via an RF input port at a cryogenic resonant circuit, the cryogenic resonant circuit including an inductive device disposed at least partially within a thermally conductive substrate and a cryogenic capacitive device coupled to the inductor; means for generating an impedance-matched RF signal at the cryogenic resonant circuit based on the input RF signal; and means for providing the impedance-matched RF signal via an RF output port to an external cryogenic device.

In Example 34, the subject matter of Example 33 optionally includes wherein: the cryogenic resonant circuit includes an amplifier circuit; the generation of the impedance-matched RF signal at the cryogenic resonant circuit includes means for generating an impedance-matched amplified RF signal; and the provision of the impedance-matched RF signal includes means for providing the impedance-matched amplified RF signal to the external cryogenic device.

In Example 35, the subject matter of any one or more of Examples 33-34 optionally include wherein the cryogenic resonant circuit is disposed within a thermally conductive enclosure.

In Example 36, the subject matter of Example 35 optionally includes wherein the thermally conductive enclosure includes a thermally conductive high-purity copper.

In Example 37, the subject matter of any one or more of Examples 35-36 optionally include wherein the thermally conductive enclosure includes a thermally conductive gold plating.

In Example 38, the subject matter of any one or more of Examples 35-37 optionally include wherein the thermally conductive enclosure includes at least one thermally conductive surface configured to mate with a thermally conductive mounting substrate.

In Example 39, the subject matter of any one or more of Examples 33-38 optionally include wherein the cryogenic capacitive device includes a low-temperature capacitive material.

In Example 40, the subject matter of any one or more of Examples 33-39 optionally include wherein the cryogenic capacitive device is configured to provide an adjustable capacitance, the adjustable capacitance modifying the amplifier impedance.

In Example 41, the subject matter of Example 40 optionally includes wherein the cryogenic capacitive device includes a plurality of conductors, each of the plurality of capacitors configured to be removable to provide the adjustable capacitance.

In Example 42, the subject matter of any one or more of Examples 40-41 optionally include means for receiving a user-selectable capacitance input to provide the adjustable capacitance.

Example 43 is one or more machine-readable medium including instructions, which when executed by a machine, cause the machine to perform operations of any of the operations of Examples 1-42.

Example 44 is an apparatus comprising means for performing any of the operations of Examples 1-42.

Example 45 is a system to perform the operations of any of the Examples 1-42.

Example 46 is a method to perform the operations of any of the Examples 1-42.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third." etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. In the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope should be determined with reference to the appended claims, along with the full scope of equivalents to which such claims are entitled.

What is claimed is:

1. A cryogenic radio-frequency resonator system comprising:
   an inductive device disposed at least partially within a s thermally conductive substrate;
   a cryogenic capacitive device coupled to the inductor and mounted on a circuit board that is disposed at least partially within the rigid thermally conductive substrate to form a rigid cryogenic resonant circuit with an associated circuit impedance value;
   a radio-frequency (RF) input port to route an input RF signal to the rigid cryogenic resonant circuit, the rigid cryogenic resonant circuit generating an impedance-matched RF signal; and
   an RF output port to provide the impedance-matched RF signal to an external cryogenic device.

2. The system of claim 1, wherein:
   the rigid cryogenic resonant circuit includes an amplifier circuit;
   the amplifier circuit generates an impedance-matched amplified RF signal; and
   the RF output port provides the impedance-matched amplified RF signal to the external cryogenic device.

3. The system of claim 1, further including a thermally conductive enclosure.

4. The system of claim 3, wherein the thermally conductive enclosure includes a thermally conductive high-purity copper.

5. The system of claim 3, wherein the rigid thermally conductive substrate is thermally coupled to the thermally conductive enclosure.

6. The system of claim 3, wherein the thermally conductive enclosure includes at least one thermally conductive surface configured to mate with a thermally conductive mounting substrate.

7. The system of claim 1, wherein the cryogenic capacitive device includes a cryogenic capacitive material.

8. The system of claim 2, wherein the cryogenic capacitive device is configured to provide an adjustable capacitance, the adjustable capacitance modifying the amplifier impedance.

9. The system of claim 8, wherein the cryogenic capacitive device includes a plurality of capacitors, each of the plurality of capacitors configured to be removable to provide the adjustable capacitance.

10. The system of claim 8, wherein the cryogenic capacitive device includes a user-selectable capacitance to provide the adjustable capacitance.

11. A cryogenic radio-frequency resonator method comprising:
    receiving an input radio-frequency (RF) signal via an RF input port at a rigid cryogenic resonant circuit, the rigid cryogenic resonant circuit including an inductive device disposed at least partially within a rigid thermally conductive substrate and a cryogenic capacitive device coupled to the inductor and mounted on a circuit board that is disposed at least partially within the rigid thermally conductive substrate to form the rigid cryogenic resonant circuit;
    generating an impedance-matched RF signal at the rigid cryogenic resonant circuit based on the input RF signal; and
    providing the impedance-matched RF signal via an RF output port to an external cryogenic device.

12. The method of claim 11, wherein:
    the rigid cryogenic resonant circuit includes an amplifier circuit;
    the generation of the impedance-matched RF signal at the rigid cryogenic resonant circuit includes generating an impedance-matched amplified RF signal; and
    the provision of the impedance-matched RF signal includes providing the impedance-matched amplified RF signal to the external cryogenic device.

13. The method of claim 11, wherein the rigid cryogenic resonant circuit is disposed within a thermally conductive enclosure.

14. The method of claim 13, wherein the thermally conductive enclosure includes a thermally conductive high-purity copper.

15. The method of claim 13, wherein the rigid substrate includes a thermally conductive substrate and is thermally coupled to the thermally conductive enclosure.

16. The method of claim 13, wherein the thermally conductive enclosure includes at least one thermally conductive surface configured to mate with a thermally conductive mounting substrate.

17. The method of claim 11, wherein the cryogenic capacitive device includes a cryogenic capacitive material.

18. The method of claim 11, wherein the cryogenic capacitive device is configured to provide an adjustable capacitance, the adjustable capacitance modifying a circuit impedance value associated with the rigid cryogenic resonant circuit.

19. The method of claim 18, wherein the cryogenic capacitive device includes a plurality of capacitors, each of the plurality of capacitors configured to be removable to provide the adjustable capacitance.

20. The method of claim 18, further including receiving a user-selectable capacitance input to provide the adjustable capacitance.

* * * * *